(12) United States Patent
Briere

(10) Patent No.: US 8,860,085 B2
(45) Date of Patent: Oct. 14, 2014

(54) III-NITRIDE SEMICONDUCTOR DEVICE

(75) Inventor: Michael A. Briere, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/117,450

(22) Filed: May 27, 2011

(65) Prior Publication Data

US 2011/0227092 A1  Sep. 22, 2011

Related U.S. Application Data

(63) Continuation of application No. 11/906,842, filed on Oct. 4, 2007, now Pat. No. 7,964,489.

(60) Provisional application No. 60/849,512, filed on Oct. 5, 2006.

(51) Int. Cl.
 *H01L 29/66* (2006.01)
 *H01L 29/778* (2006.01)
 *H01L 29/20* (2006.01)
 *H01L 29/51* (2006.01)

(52) U.S. Cl.
 CPC ......... *H01L 29/7787* (2013.01); *H01L 29/2003* (2013.01); *H01L 29/66462* (2013.01); *H01L 29/51* (2013.01)
 USPC .................. 257/192; 257/E21.407; 257/197; 257/198

(58) Field of Classification Search
 USPC ........................ 257/192, 197, 198, E21.407
 See application file for complete search history.

(56) References Cited

U.S. PATENT DOCUMENTS

| | | | |
|---|---|---|---|
| 5,808,348 A * | 9/1998 | Ito et al. | 257/410 |
| 6,878,593 B2 * | 4/2005 | Khan et al. | 438/285 |
| 2003/0205721 A1 * | 11/2003 | Nishii et al. | 257/194 |
| 2004/0041169 A1 * | 3/2004 | Ren et al. | 257/192 |

* cited by examiner

*Primary Examiner* — Dale E Page

(74) *Attorney, Agent, or Firm* — Farjami & Farjami LLP

(57) ABSTRACT

A III-nitride heterojunction power semiconductor device having a barrier layer that includes a region of reduced nitrogen content.

17 Claims, 3 Drawing Sheets

III-NITRIDE SEMICONDUCTOR DEVICE

RELATED APPLICATION

This is a continuation of application Ser. No. 11/906,842 now U.S. Pat. No. 7,964,489 filed Oct. 4, 2007.

This application is based on and claims priority to the U.S. Provisional Application Ser. No. 60/849,512, filed on Oct. 5, 2006, entitled Process for Manufacture of III-Nitride Devices Including Local Decomposition Step to which a claim of priority is hereby made and the disclosure of which is incorporated by reference.

DEFINITION

III-nitride or III-nitride semiconductor refers to a semiconductor alloy from the InAlGaN system including but not limited to GaN, AlGaN, AlN, InGaN, InAlGaN, InN, or the like.

BACKGROUND OF THE INVENTION

The present invention relates to III-nitride heretojunction type devices and methods for fabrication thereof.

Known III Nitride heterojunction devices include the heterojunction of two III-nitride semiconductor bodies having different band gaps and/or lattice constants that includes a carrier rich region referred as a two dimensional electron gas or 2-DEG which permits conduction between a source electrode and a drain electrode. Typically, a gate electrode is disposed between the source and the drain electrodes which is operable to interrupt or restore the 2-DEG in order to switch the current from an ON state to an OFF state and vice versa. III-nitride devices have a conduction resistance R and a charge $Q_{SW}$ measured between the source and drain electrodes.

It is very desirable in many applications to minimize the product of R and $Q_{SW}$.

Moreover, typical III-nitride devices are depletion mode devices.

It is desirable to obtain an enhancement mode III-nitride power device in order to reduce the amount of power necessary for the operation thereof, among other reasons.

SUMMARY OF THE INVENTION

It is an object of the present invention to provide a III-nitride heterojunction semiconductor device.

It is another object of the present invention to provide a method for fabrication of a III-nitride heterojunction semiconductor device.

According to one aspect of the present invention, the concentration of carriers in selected regions of the 2-DEG is changed by selective reduction of the nitrogen content of at least one of the III-nitride bodies in the III-nitride heterojunction of the device. Thus, in one embodiment, a device according to the present invention includes a III-nitride heterojunction which includes a barrier layer over a channel layer, in which the barrier layer includes a region having a nitrogen content that is less than the rest of the barrier layer.

According to one aspect of the present invention, the region of reduced nitrogen content reduces the concentration of carriers in the 2-DEG under the gate of the device. As a result, $Q_{SW}$ is minimized due to the lower charge in the 2-DEG under the gate region, which may reduce the product of R and $Q_{SW}$.

According to another aspect of the present invention, the region of reduced nitrogen content increases the concentration of carriers in the 2-DEG under the power electrodes of the device.

Other features and advantages of the present invention will become apparent from the following description of the invention which refers to the accompanying drawings.

DETAILED DESCRIPTION OF THE EMBODIMENTS

Figure 1:
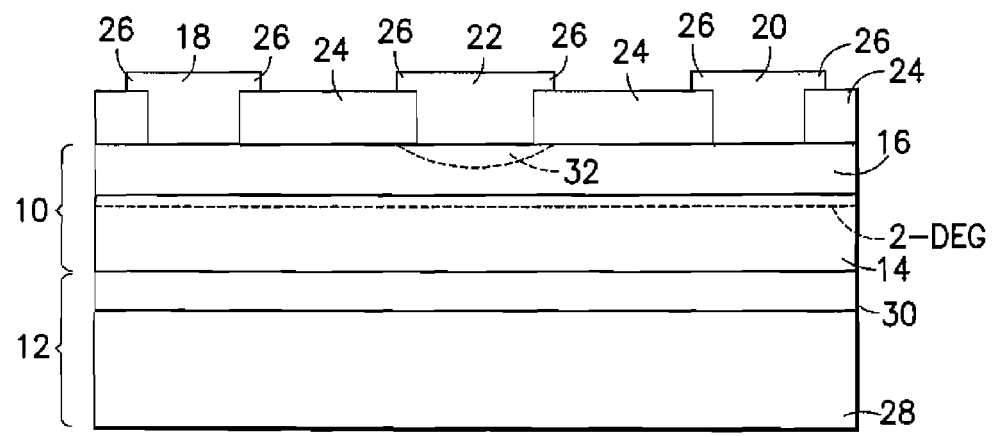
FIG. 1 illustrates an active cell of a III-nitride heterojunction power semiconductor device according to one embodiment of the present invention.

Referring to FIG. 1, a III-nitride heterojunction power semiconductor device according to an embodiment of the present invention includes an active III-nitride heterojunction 10, formed over a support body 12. Active III-nitride heterojunction 10 includes a first III-nitride semiconductor body 14 serving as a channel layer, and second III-nitride semiconductor body 16 formed on and having a band gap and/or lattice constant different from first III-nitride semiconductor body 14 serving as a barrier layer. Note that the thickness and composition of barrier layer 16 is selected to generate a carrier rich region known as a two-dimensional electron gas (2-DEG) at or near the junction of bodies 14, 16, as is well known in the art.

A device according to the present invention further includes first power electrode 18 (e.g. source electrode), a second power electrode 20 (e.g. drain electrode) each electrode 18, 20 being ohmically coupled to preferably barrier layer 16, and a gate electrode 22, which is preferably schottky coupled to barrier layer 16, the function of which is to, in response to an electrical signal external to the device, control the conductivity of the 2-DEG, whereby current between power electrodes 18, 20 can be switched ON/OFF selectively.

Note further that a device according to the present invention further includes a diffusion barrier 24 formed over barrier layer 16 through which electrodes 18, 20, 22 reach barrier layer 16. Preferably, gate electrode 22, as well as power electrodes 18, 20, each includes a field plate portion 26 extending from an edge thereof over a portion of diffusion barrier 24.

In the preferred embodiment, support body 10 includes a silicon substrate 28, and transition body 30 (e.g. AlN), over which channel layer 14 is grown. Other possible substrate materials are SiC, or Sapphire. A substrate composed of a material that is native to the InAlGaN system may also be used (e.g. a GaN substrate), in which case transition layer 30 may be unnecessary.

According to an aspect of the present invention, a region 32 in barrier layer 16 under gate 22 includes a smaller concentration of nitrogen compared to regions under power electrodes 18 and 20. Thus, in the preferred embodiment, in which barrier layer 16 is composed of AlGaN, region 32 includes less nitrogen and a larger concentration of aluminum compared to regions under power electrodes 18, 20. Consequently, $Q_{SW}$ under gate 22 is reduced compared to the charge under power electrodes 18, 20. As a result, the product of R and $Q_{SW}$ is reduced.

Figure 2:
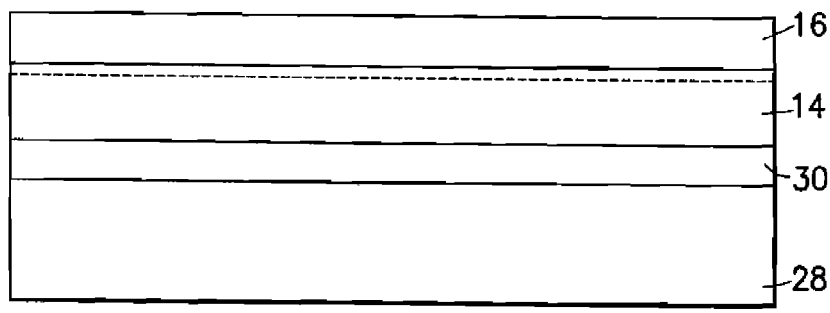
FIGS. 2-4 illustrate selected steps in the fabrication of a III-nitride power semiconductor device according to the present invention.
Figure 3:
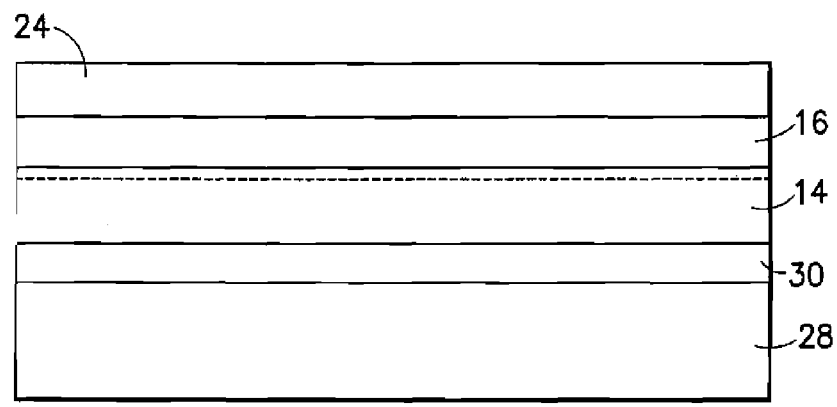
Figure 4:
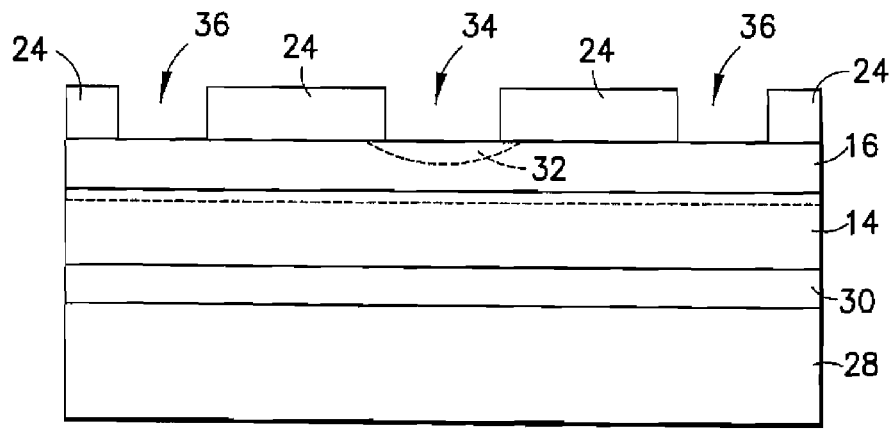

Referring now to FIGS. 2-4, to fabricate a device according to the present invention, first a stack including substrate 28 (e.g. AlN), channel layer 14 (e.g. GaN), and barrier layer 16 (e.g. AlGaN) is fabricated according to any desired method resulting in the stack illustrated by FIG. 2.

Next, as illustrated by FIG. 3, a diffusion barrier 24 is formed on barrier layer 16. A suitable material for diffusion barrier 24 has the capability to withstand degradation when exposed to temperatures above the temperature that causes decomposition of the III-nitride material that constitutes barrier layer 16 and is capable of preventing nitrogen from escaping from barrier layer 16 when barrier layer 16 is exposed to a temperature higher than the decomposition temperature thereof. Such materials include but are not limited to silicon nitride ($Si_3N_4$), TiN, AlN, GaN or the like.

Thereafter, as illustrated by FIG. 4, an opening 34 is formed in passivation layer 24 exposing a portion of barrier layer 16, and the stack is heated to a temperature above the temperature of decomposition of the III-nitride material that constitutes barrier layer 16, which then allows nitrogen to break away and escape through opening 34 resulting in the formation of region 32 thereunder. Thus, in the preferred embodiment, heat is applied to reach at least the temperature of decomposition of AlGaN to allow for decomposition of AlGaN below opening 34 to obtain a region which has a reduced concentration of nitrogen and a greater concentration of aluminum compared to regions in barrier layer 16 under power electrodes 18, 20. The temperature selected and the time and ramp of the decomposition temperature is appropriately chosen, and, for an AlGaN/GaN system, may be from 900° C. to 1100° C. for a short enough time to prevent full damage to the wafer. This will, for example, drive nitrogen from the exposed area, leaving the AlGaN layer in that area with a richer Al content. Preferably, decomposition takes place in the presence of chlorinated gas, e.g. HCL or the like in order to attack the metal (e.g. aluminum) accumulated at the surface of barrier layer 16 at the bottom of opening 34 while decomposition takes place. Then, openings 36 are formed in passivation layer 24 to allow for the reception of power electrodes 18, 20, and the power electrodes 18, 20 and gate electrode 22 are formed in openings 36, 34 according to any desired method, thereby obtaining a device according to FIG. 1.

Figure 5:
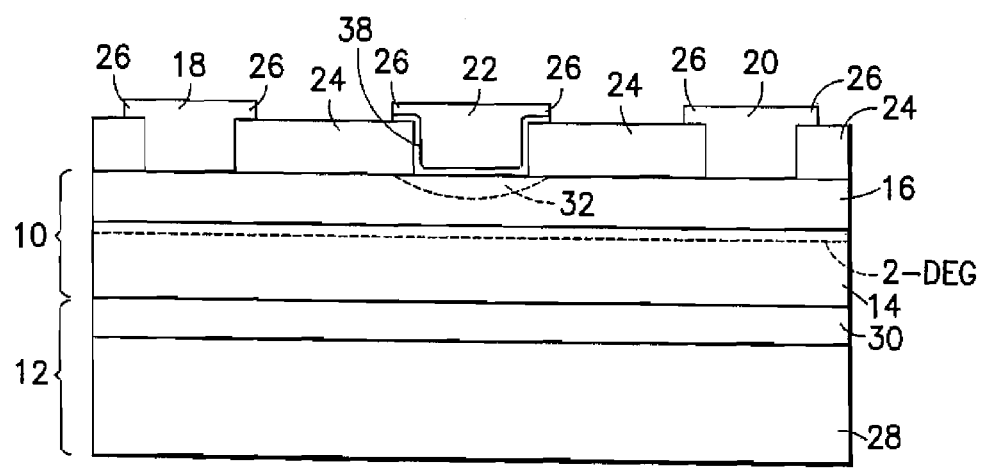
FIG. 5 illustrates an active cell of a III-nitride heterojunction power semiconductor device according to another embodiment of the present invention.

Referring to FIG. 5, in which like numerals identify like features, in another embodiment of the present invention, a gate dielectric body 38 may be formed in opening 34 over barrier layer 16 before forming gate electrode 22, whereby a device having an insulated gate is obtained.

During the decomposition of III-nitride material (e.g. AlGaN) that constitutes barrier layer 16, the material may lose thickness, while the aluminum content thereof may increase. The thinning of barrier layer 16 in region 32 leads to the reduction of the density of carriers in the 2-DEG positioned thereunder, while the increase in the concentration of aluminum in region 32 may lead to the increase in the concentration of carriers. These competing effects may be managed to obtain a desired density of carriers under region 32. In one embodiment, the 2-DEG under region 32 may be interrupted in order to render the same not conductive. Thus, in any embodiment described herein, an enhancement mode device may be obtained whereby an application of the proper voltage to gate electrode 22 may restore the 2-DEG and render the 2-DEG conductive.

Figure 6:
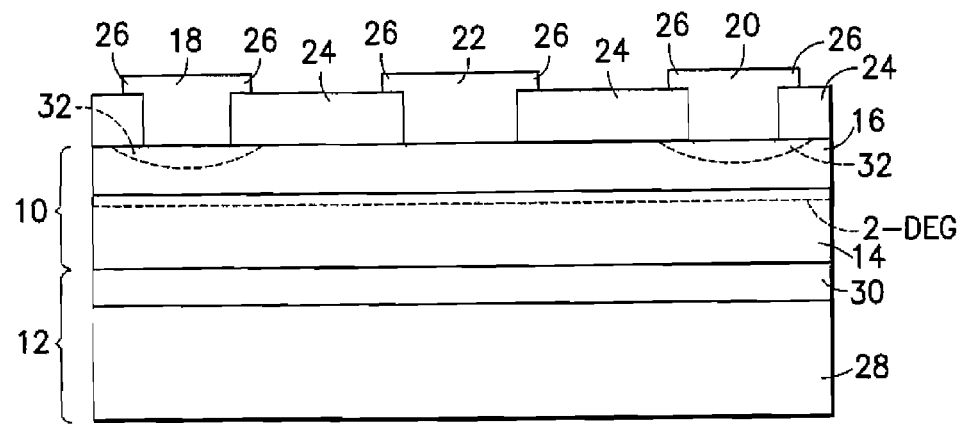
FIG. 6 illustrates an active cell of a III-nitride heterojunction power semiconductor device according to a third embodiment of the present invention.

The principles set forth above are not limited to devices that include a region 32 under gate 22. Thus, referring to FIG. 6, in which like numerals identify like features, in a device according to the third embodiment, regions 32 having a lower nitrogen content are formed under power electrodes 18, 20. In the preferred embodiment in which barrier layer 16 is composed of AlGaN, regions 32 of lower nitrogen content and thus richer in aluminum are formed under electrodes 18, 20. In this embodiment, regions 32 are formed such that the larger aluminum content leads to a higher concentration of carriers in the 2-DEG under electrodes 18, 20. Thus, conductivity under electrodes 18, 20 is increased to obtain a better ohmic coupling.

To fabricate a device according to the third embodiment, openings 36 in diffusion barrier are first opened prior to opening 34, and in a thermal step, as described before, III-nitride material at the bottom of openings 36 is decomposed to obtain regions 32. Thereafter, opening 34 is formed in diffusion barrier 24 and electrodes 18, 20 and gate electrode 22 are formed in openings 34, 36. Note that in an alternative embodiment, a gate dielectric 32 (see FIG. 5) may be formed under gate electrode 22 to obtain an insulated gate device.

Figure 7:
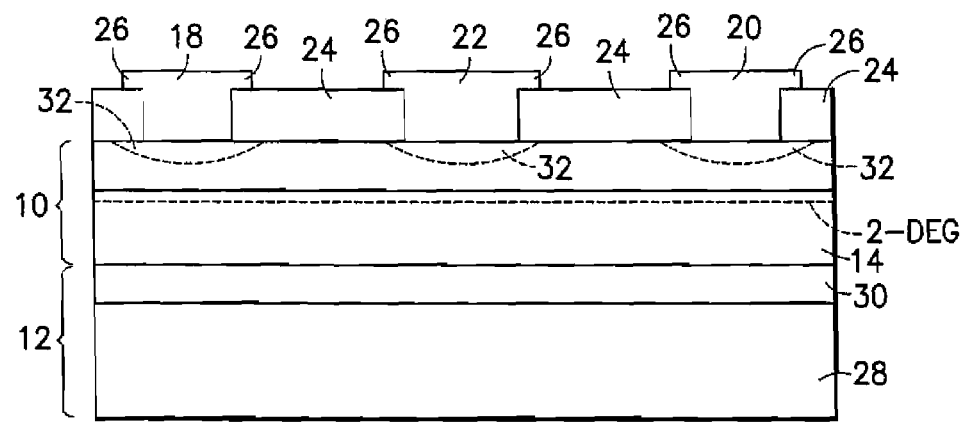
FIG. 7 illustrates an active cell of a III-nitride heterojunction power semiconductor device according to a fourth embodiment of the present invention.

Referring now to FIG. 7, in which like numerals identify like features, a device according to the fourth embodiment includes region 32 having a nitrogen content less than the rest of barrier layer 16 according to the present invention under electrodes 18, 20 and gate electrode 22. Regions 32 under electrodes 18, 20 may be configured according to the third embodiment to increase the density of carriers in the 2-DEG under electrodes 18, 20 and region 32 under gate 22 may be configured to reduce the density of carriers in the 2-DEG under gate 22 according to the first and second embodiments. Note that in one embodiment region 32 under gate 22 may be configured to interrupt the 2-DEG in order to obtain an enhancement mode device.

To fabricate a device according to the fourth embodiment, either opening 34 may be formed first followed by a decomposition step according to the present invention, and then openings 36 may be formed followed by a decomposition step according to the present invention; or openings 36 may be formed first followed by a decomposition step according to the present invention, and then opening 34 is formed followed by a decomposition step according to the present invention. Thereafter, electrodes 18, 20 and gate electrode 22 are formed to obtain a device according to the fourth embodiment.

Alternatively, a gate dielectric body 32 may be formed prior to the formation of gate electrode 22 to obtain an insulated gate device according to the fourth embodiment of the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:
1. A III-nitride power semiconductor device comprising:
  a III-nitride heterojunction comprising a III-nitride channel layer and a III-nitride barrier layer over said III-nitride channel layer to generate a two-dimensional electron gas;

said III-nitride barrier layer being decomposed so as to achieve a reduced nitrogen region in said III-nitride barrier layer, compared to an adjoining region of said III-nitride barrier layer;

said reduced nitrogen region situated in said III-nitride barrier layer and substantially confined under at least one of a gate, a source electrode, and a drain electrode of said III-nitride power semiconductor device such that said reduced nitrogen region does not extend between said gate and either of said source electrode and said drain electrode, said reduced nitrogen region having an increased group III semiconductor concentration compared to said adjoining region of said III-nitride barrier layer.

2. The III-nitride power semiconductor device of claim 1, wherein said gate of said III-nitride power semiconductor device is disposed over said reduced nitrogen region.

3. The III-nitride power semiconductor device of claim 1, wherein at least one of said source electrode and said drain electrode of said III-nitride power semiconductor device is disposed over said reduced nitrogen region.

4. The III-nitride power semiconductor device of claim 1, wherein said III-nitride barrier layer comprises AlGaN.

5. The III-nitride power semiconductor device of claim 1, wherein said III-nitride channel layer comprises GaN.

6. A III-nitride power semiconductor device comprising:
a III-nitride heterojunction comprising a III-nitride channel layer and a III-nitride barrier layer over said III-nitride channel layer to generate a two-dimensional electron gas;
said III-nitride barrier layer being decomposed so as to achieve a reduced thickness region in said III-nitride barrier layer and substantially confined under at least one of a gate, a source electrode, and a drain electrode of said III-nitride power semiconductor device such that said reduced thickness region does not extend between said gate and either of said source electrode and said drain electrode;
wherein a thickness of said reduced thickness region is less than a thickness of said III-nitride barrier layer, said reduced thickness region having an increased group III semiconductor concentration compared to an adjoining region of said III-nitride barrier layer.

7. The III-nitride power semiconductor device of claim 6, wherein said gate of said III-nitride power semiconductor device is disposed over said reduced thickness region.

8. The III-nitride power semiconductor device of claim 6, wherein at least one of said source electrode and said drain electrode of said III-nitride power semiconductor device is disposed over said reduced thickness region.

9. The III-nitride power semiconductor device of claim 6, wherein said III-nitride barrier layer comprises AlGaN.

10. The III-nitride power semiconductor device of claim 6, wherein said III-nitride channel layer comprises GaN.

11. A III-nitride power semiconductor device comprising:
a III-nitride heterojunction that includes a III-nitride channel layer and a III-nitride barrier layer formed over said channel layer to generate a two-dimensional electron gas, said III-nitride barrier layer being decomposed so as to have reduced nitrogen region situated therein, compared to an adjoining region of said III-nitride barrier layer, said reduced nitrogen region having an increased group III semiconductor concentration compared to said adjoining region of said III-nitride barrier layer;
first and second power electrodes being coupled to said III-nitride heterojunction;
a gate situated between said first and second power electrodes, said gate coupled to said III-nitride heterojunction, wherein said gate is disposed directly over said reduced nitrogen region, said reduced nitrogen region being substantially confined under said gate such that said reduced nitrogen region does not extend between said gate and either of said first and second power electrodes.

12. The III-nitride power semiconductor device of claim 11, wherein said III-nitride barrier layer comprises of AlGaN and said III-nitride channel layer comprises GaN.

13. The III-nitride power semiconductor device of claim 11, wherein said gate includes a Schottky gate electrode coupled to said III-nitride heterojunction.

14. The III-nitride power semiconductor device of claim 11, wherein said gate includes a gate electrode and a gate dielectric disposed between said gate electrode and said III-nitride heterojunction.

15. The III-nitride power semiconductor device of claim 11, wherein said III-nitride heterojunction is disposed over a support body that includes a silicon substrate and a III-nitride transition layer.

16. The III-nitride power semiconductor device of claim 15, wherein said transition layer comprises AlN.

17. The III-nitride power semiconductor device of claim 11, wherein said III-nitride heterojunction is disposed over a support body that includes a substrate and a transition layer, said substrate being selected from the group consisting of SiC and sapphire.

* * * * *